(12) United States Patent
Philosof et al.

(10) Patent No.: US 12,394,486 B2
(45) Date of Patent: Aug. 19, 2025

(54) SETTING OPTIMAL THRESHOLD VOLTAGES FOR READING DATA FROM A MEMORY DEVICE BASED ON A CHANNEL DISTRIBUTION

(71) Applicant: SAMSUNG ELECTRONICS CO., LTD., Suwon-si (KR)

(72) Inventors: Tal Philosof, Givatayim (IL); Lior Kissos, Netanya (IL); Ariel Doubchak, Herzliya (IL); Amit Berman, Binyamina (IL)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 189 days.

(21) Appl. No.: 18/454,144

(22) Filed: Aug. 23, 2023

(65) Prior Publication Data

US 2025/0069660 A1  Feb. 27, 2025

(51) Int. Cl.
*G11C 7/00* (2006.01)
*G11C 16/08* (2006.01)
*G11C 16/10* (2006.01)
*G11C 16/26* (2006.01)
*G11C 29/52* (2006.01)

(52) U.S. Cl.
CPC ............ *G11C 16/08* (2013.01); *G11C 16/102* (2013.01); *G11C 16/26* (2013.01); *G11C 29/52* (2013.01)

(58) Field of Classification Search
CPC ....... G11C 7/1051; G11C 7/22; G11C 7/1072; G11C 7/1006; G11C 7/1066

USPC ..................................................... 365/189.15
See application file for complete search history.

(56) References Cited

U.S. PATENT DOCUMENTS 8,239,734 B1 *  8/2012  Shalvi ................. G06F 11/1092
714/763

OTHER PUBLICATIONS

Brian M. Kurkoski, et al., "Quantization of Binary-Input Discrete Memoryless Channels", IEEE Transactions on Information Theory, vol. 60, No. 8, Aug. 2014.
Thomas M. Cover, et al., "Elements of Information Theory", Second Edition. 1938-2012.
Viterbi Algorithm—Wikipedia: https://en.wikipedia.org/wiki/Viterbi_algorithm, Dec. 28, 2022.

* cited by examiner

*Primary Examiner* — Son T Dinh
(74) *Attorney, Agent, or Firm* — Morgan, Lewis & Bockius LLP

(57) ABSTRACT

Provided are a memory system, a method of reading data and a method of finding read thresholds. The method of finding read thresholds includes: selecting a channel distribution among a plurality of channel distributions that corresponds to a read page of the memory device to be read in response to a read command; generating a Trellis diagram based on a decoding scheme and a type of the read page; determining an optimal path through the Trellis diagram using the selected channel distribution according to a dynamic programming algorithm; and finding the read thresholds from the optimal path.

20 Claims, 20 Drawing Sheets

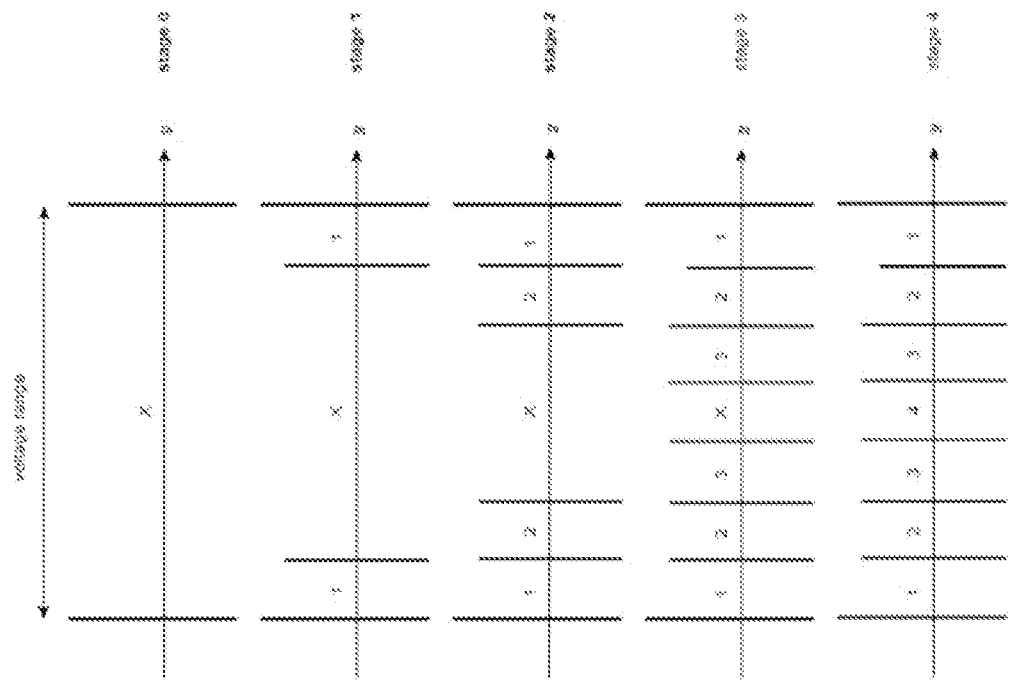

FIG. 15

- Stage 0: edge (0,8) to (1,6):

$$i((0,6) \to (1,8)) =$$

$$p(b=0) \cdot p(y=0|b=0) \cdot \log\left(\frac{p(y=0|b=0) + p(y=6|b=0) + p(y=7|b=0)}{p(y=0) + p(y=6) + p(y=7)}\right) +$$

$$+ p(b=0) \cdot p(y=6|b=0) \cdot \log\left(\frac{p(y=0|b=0) + p(y=6|b=0) + p(y=7|b=0)}{p(y=0) + p(y=6) + p(y=7)}\right) +$$

$$+ p(b=0) \cdot p(y=7|b=0) \cdot \log\left(\frac{p(y=0|b=0) + p(y=6|b=0) + p(y=7|b=0)}{p(y=0) + p(y=6) + p(y=7)}\right) +$$

$$+ p(b=1) \cdot p(y=0|b=1) \cdot \log\left(\frac{p(y=0|b=1) + p(y=6|b=1) + p(y=7|b=1)}{p(y=0) + p(y=6) + p(y=7)}\right) +$$

$$+ p(b=1) \cdot p(y=6|b=1) \cdot \log\left(\frac{p(y=0|b=1) + p(y=6|b=1) + p(y=7|b=1)}{p(y=0) + p(y=6) + p(y=7)}\right) +$$

$$+ p(b=1) \cdot p(y=7|b=1) \cdot \log\left(\frac{p(y=0|b=1) + p(y=6|b=1) + p(y=7|b=1)}{p(y=0) + p(y=6) + p(y=7)}\right)$$

Plug in all the probabilities $\quad i((0,6) \to (1,8)) = 0.016457$

FIG. 17

For z = 0: $LLR(z=0) = log\left(\frac{P(y=0|b=0)+P(y=1|b=0)+P(y=7|b=0)}{P(y=0|b=1)+P(y=1|b=1)+P(y=7|b=1)}\right) = 0.5519$ For z = 1: $LLR(z=1) = log\left(\frac{P(y=2|b=0)+P(y=6|b=0)}{P(y=2|b=1)+P(y=6|b=1)}\right) = -1.0$ For z = 2: $LLR(z=2) = log\left(\frac{P(y=3|b=0)+P(y=5|b=0)}{P(y=3|b=1)+P(y=5|b=1)}\right) = -1.237$ For z = 3: $LLR(z=3) = log\left(\frac{P(y=4|b=0)}{P(y=4|b=1)}\right) = -0.32193$

FIG. 18

Viterbi Algorithm:

Initialize: set the accumulated metric of state in the first stage to zero.

Run over all stages sequentially starting the first stage
{

In each stage run over all states
    {

1. Sum the accumulated metric of input state with the appropriate branch metric.
        2. Set the accumulated metric of the output state to be the maximum from all input branches as computed in 1
        3. Save a pointer to the previous state of the winning path in 2 and set it in *winning_path* variable } # end states loop } # end stages loop

SETTING OPTIMAL THRESHOLD VOLTAGES FOR READING DATA FROM A MEMORY DEVICE BASED ON A CHANNEL DISTRIBUTION

TECHNICAL FIELD

Exemplary embodiments of the present inventive concept relate generally to reading data from a memory, and more particularly to setting optimal threshold voltage levels for reading the data.

DISCUSSION OF RELATED ART

Modern NAND flash memory devices allow for several bits of data to be stored in each memory cell, providing improvements in manufacturing costs and performance. A memory cell in which multiple bits of data are stored may be referred to as a multi-level memory cell (MLC). A multi-level memory cell partitions a threshold voltage range of a memory cell into several voltage states, and data values written to the memory cell are extracted using the memory cell voltage levels.

However, the aggressive scaling and the growing number of bits per cell of a multi-level NAND flash memory results in higher error rates. Error correction codes are required to handle more errors, yet with less circuit area and power consumption. Thus, there is a need for low-complexity high-efficient error reduction methods.

SUMMARY

According to an embodiment of the present disclosure, a memory system including a memory device having a plurality of memory cells and a memory controller is provided. The memory controller is configured to determine a channel distribution for each page of the memory device to generate a plurality of channel distributions, select a channel distribution among the plurality of channel distributions that corresponds to a read page of the memory device to read in response to a read command, generate a Trellis diagram based on a decoding scheme and a type of the read page, determine an optimal path through the Trellis diagram using the selected channel distribution according to a dynamic programming algorithm, find read thresholds from the optimal path, and read the read page from the memory device using the read thresholds. For example, the dynamic programming algorithm may be a Viterbi algorithm.

According to an embodiment of the present disclosure, a method of reading data from a memory device of a memory system includes: a memory controller of the memory system determining a channel distribution for each page of the memory device to generate a plurality of channel distributions; selecting a channel distribution among the plurality of channel distributions that corresponds to a read page of the memory device to read in response to a read command; generating a Trellis diagram based on a decoding scheme and a type of the read page; determining an optimal path through the Trellis diagram using the selected channel distribution according to a dynamic programming algorithm; finding read thresholds from the optimal path; and reading the read page from the memory device using the read thresholds. For example, the dynamic programming algorithm may be a Viterbi algorithm.

According to an embodiment of the present disclosure, a memory system including a memory device having a plurality of memory cells and a memory controller is provided. The memory controller is configured to select a channel distribution among a plurality of channel distributions that corresponds to a read page of the memory device to read in response to a read command, generate a Trellis diagram based on a decoding scheme and a type of the read page, determine an optimal path through the Trellis diagram using the selected channel distribution according to a dynamic programming algorithm, and find optimal read thresholds using the optimal path for performing a read of the read page.

According to an embodiment of the present disclosure, a method of finding read thresholds for reading a memory device of a memory system includes: a memory controller of the memory system selecting a channel distribution among a plurality of channel distributions that corresponds to a read page of the memory device to read in response to a read command; generating a Trellis diagram based on a decoding scheme and a type of the read page; determining an optimal path through the Trellis diagram using the selected channel distribution according to a dynamic programming algorithm; and finding the read thresholds from the optimal path.

BRIEF DESCRIPTION OF THE DRAWINGS

The above and other features of the present inventive concept will become more apparent by describing in detail exemplary embodiments thereof with reference to the accompanying drawings, in which:

FIG. 13A-13C illustrate a method of calculating the optimal thresholds according to an exemplary embodiment of the inventive concept;

FIG. 15 illustrates an example of calculating a branch metric of a branch for use in one of the methods according to an exemplary embodiment of the inventive concept;

FIG. 17 illustrates an exemplary computation of a LLR table that may be used to error correct data read using the above methods;

FIG. 18 illustrates exemplary pseudo code for a Viterbi algorithm that may be used in the above method according to an exemplary embodiment of the inventive concept.

DETAILED DESCRIPTION

Figure 1:
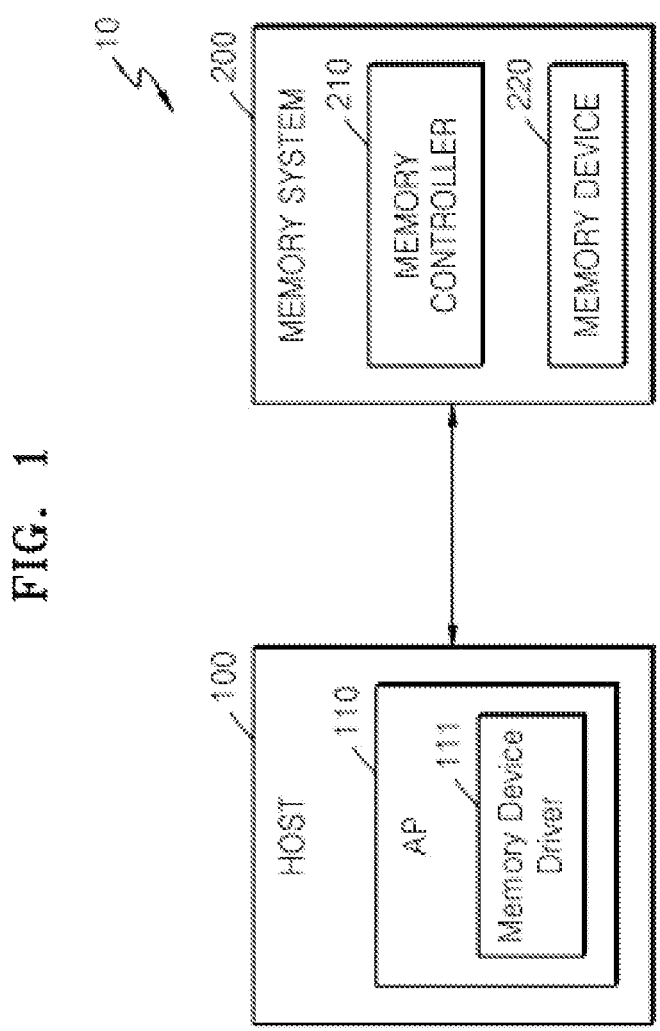
FIG. 1 is a block diagram illustrating an implementation of a data processing system including a memory system, according to an exemplary embodiment of the inventive concept.

Exemplary embodiments of the present inventive concept will be described more fully hereinafter with reference to the accompanying drawings. Like reference numerals may refer to like elements throughout the accompanying drawings.

It should be understood that descriptions of features or aspects within each exemplary embodiment should typically be considered as available for other similar features or aspects in other exemplary embodiments, unless the context clearly indicates otherwise.

As used herein, the singular forms "a", "an" and "the" are intended to include the plural forms as well, unless the context clearly indicates otherwise.

Herein, when one value is described as being about equal to another value or being substantially the same as or equal to another value, it is to be understood that the values are equal to each other to within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

FIG. 1 is a block diagram illustrating an implementation of a data processing system including a memory system, according to an exemplary embodiment of the inventive concept.

Referring to FIG. 1, the data processing system 10 may include a host 100 and a memory system 200. The memory system 200 shown in FIG. 1 may be utilized in various systems that include a data processing function. The various systems may be various devices including, for example, mobile devices, such as a smartphone or a tablet computer. However, the various devices are not limited thereto.

The memory system 200 may include various types of memory devices. Herein, exemplary embodiments of the inventive concept will be described as including a memory device that is a non-volatile memory. However, exemplary embodiments are not limited thereto. For example, the memory system 200 may include a memory device that is a volatile memory.

According to exemplary embodiments, the memory system 200 may include a non-volatile memory device such as, for example, a read-only memory (ROM), a magnetic disk, an optical disk, a flash memory, etc. The flash memory may be a memory that stores data according to a change in a threshold voltage of a metal-oxide-semiconductor field-effect transistor (MOSFET), and may include, for example, NAND and NOR flash memories. The memory system 200 may be implemented using a memory card including a non-volatile memory device such as, for example, an embedded multimedia card (eMMC), a secure digital (SD) card, a micro SD card, or a universal flash storage (UFS), or the memory system 200 may be implemented using, for example, an SSD including a non-volatile memory device. Herein, the configuration and operation of the memory system 200 will be described assuming that the memory system 200 is a non-volatile memory system. However, the memory system 200 is not limited thereto. The host 100 may include, for example, a system-on-chip (SoC) application processor (AP) mounted on, for example, a mobile device, or a central processing unit (CPU) included in a computer system.

As described above, the host 100 may include an AP 110. The AP 110 may include various intellectual property (IP) blocks. For example, the AP 110 may include a memory device driver 111 that controls the memory system (e.g., a non-volatile memory system) 200. The host 100 may communicate with the non-volatile memory system 200 to transmit a command (e.g., a read command, a write command, an erase command, etc.) related to a memory operation and receive a confirm command in response to the transmitted command.

The memory system 200 may include, for example, a memory controller 210 and a memory device 220. The memory controller 210 may receive a command related to a memory operation from the host 100, generate an internal command and an internal clock signal using the received command, and provide the internal command and the internal clock signal to the memory device 220. The memory device 220 may store write data in a memory cell array in response to the internal command, or may provide read data to the memory controller 210 in response to the internal command.

Figure 4:
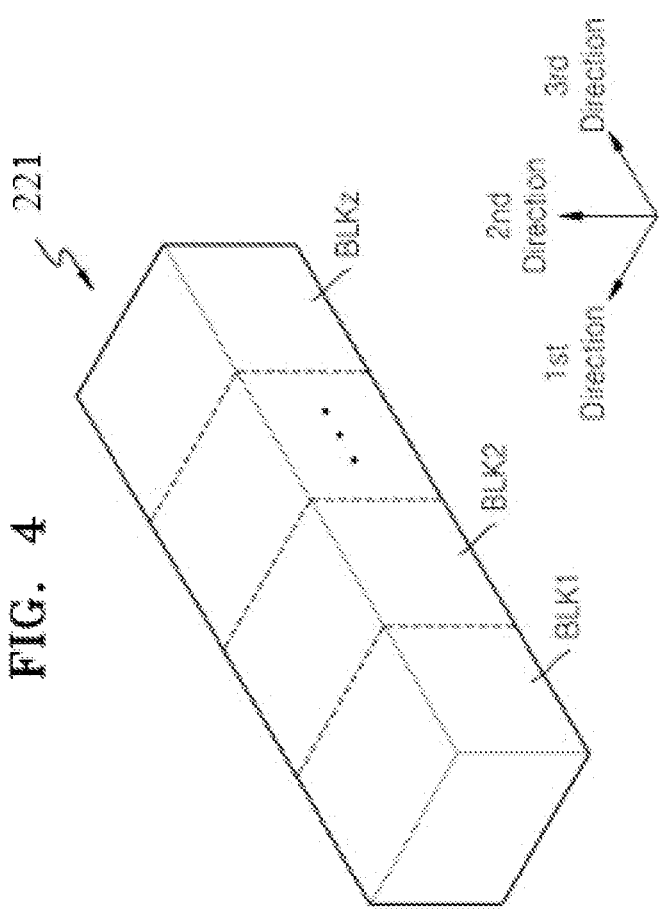
FIG. 4 is a block diagram of the memory cell array of FIG. 2, according to an exemplary embodiment of the inventive concept.

The memory device 220 may include a memory cell array that retains data stored therein, even when the memory device 220 is not powered on. The memory cell array may include memory cells, for example, a NAND or NOR flash memory, a magnetoresistive random-access memory (MRAM), a resistive random-access memory (RRAM), a ferroelectric access-memory (FRAM), or a phase change memory (PCM). For example, when the memory cell array includes a NAND flash memory, the memory cell array may include a plurality of blocks and a plurality of pages. Data may be programmed and read in units of pages, and data may be erased in units of blocks. An example of memory blocks included in a memory cell array is shown in FIG. 4.

Figure 2:
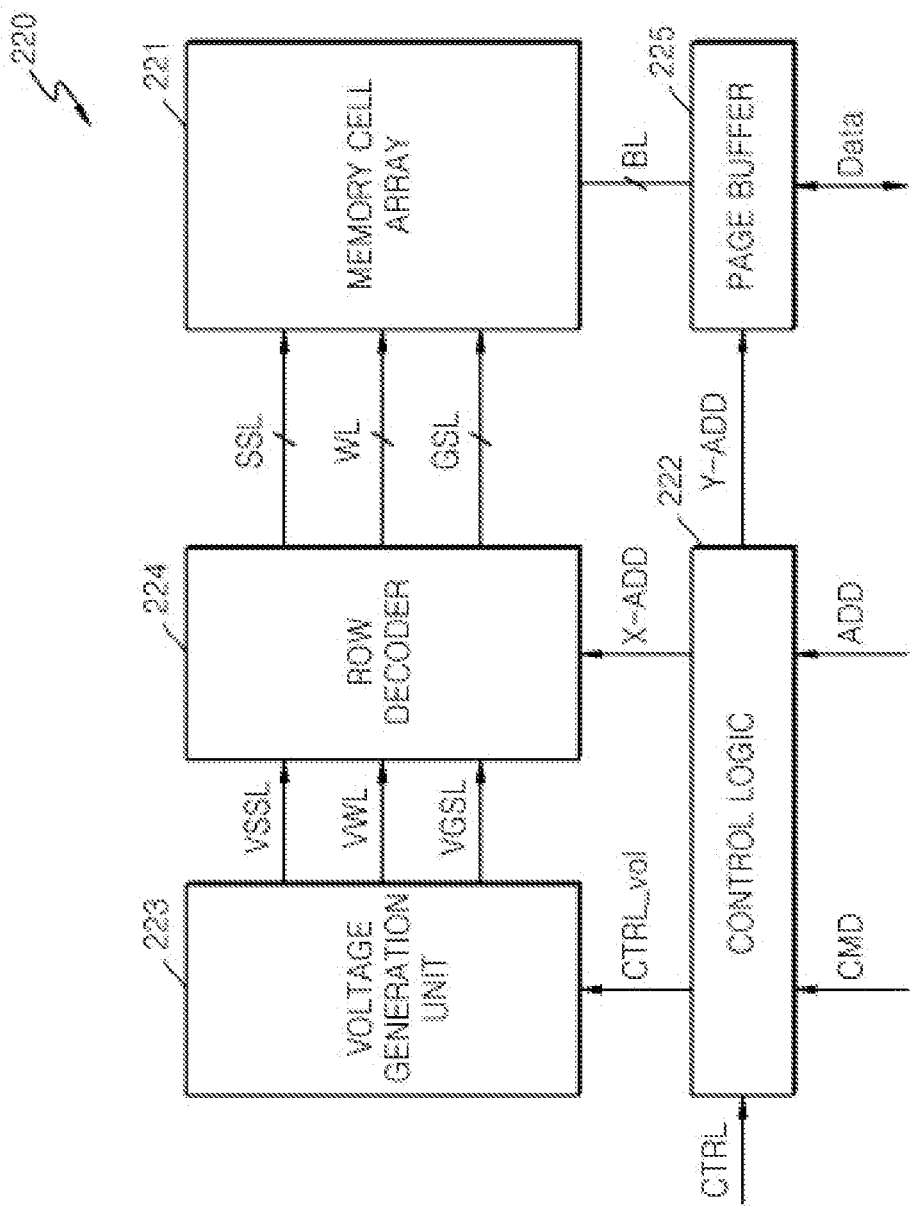
FIG. 2 is a detailed block diagram of a non-volatile memory device of FIG. 1, according to an exemplary embodiment of the inventive concept.

FIG. 2 is a detailed block diagram of the memory device (e.g., a non-volatile memory device) 220 of FIG. 1, according to an exemplary embodiment of the inventive concept.

Referring to FIG. 2, the memory device (e.g., a non-volatile memory device) 220 may include, for example, a memory cell array 221, a control logic 222, a voltage generation unit 223, a row decoder 224, and a page buffer 225.

The memory cell array 221 may be connected to one or more string select lines SSL, a plurality of word lines WL, one or more ground select lines GSL, and a plurality of bit lines BL. The memory cell array 221 may include a plurality of memory cells disposed at intersections between the plurality of word lines WL and the plurality of bit lines BL.

The control logic 222 may receive a command CMD (e.g., an internal command) and an address ADD from the memory controller 210 and receive a control signal CTRL for controlling various functional blocks within the memory device 220 from the memory controller 210. The control logic 222 may output various control signals for writing data to the memory cell array 221 or reading data from the memory cell array 221, based on the command CMD, the address ADD, and the control signal CTRL. In this manner, the control logic 222 may control the overall operation of the memory device 220.

The various control signals output by the control logic 222 may be provided to the voltage generation unit 223, the row decoder 224, and the page buffer 225. For example, the control logic 222 may provide the voltage generation unit 223 with a voltage control signal CTRL_vol, provide the row decoder 224 with a row address X-ADD, and provide the page buffer 225 with a column address Y-ADD.

The voltage generation unit 223 may generate various voltages for performing program, read, and erase operations on the memory cell array 221 based on the voltage control signal CTRL_vol. For example, the voltage generation unit 223 may generate a first driving voltage VWL for driving the plurality of word lines WL, a second driving voltage VSSL for driving the plurality of string select lines SSL, and a third driving voltage VGSL for driving the plurality of ground select lines GSL. In this case, the first driving voltage VWL may be a program voltage (e.g., a write voltage), a read voltage, an erase voltage, a pass voltage, or a program verify voltage. In addition, the second driving voltage VSSL may be a string select voltage (e.g., an on voltage or an off voltage). Further, the third driving voltage VGSL may be a ground select voltage (e.g., an on voltage or an off voltage).

The row decoder 224 may be connected to the memory cell array 221 through the plurality of word lines WL, and may activate a part of the plurality of word lines WL in response to the row address X-ADD received from the control logic 222. For example, in a read operation, the row decoder 224 may apply a read voltage to a selected word line and a pass voltage to unselected word lines.

In a program operation, the row decoder 224 may apply a program voltage to a selected word line and a pass voltage to unselected word lines. In an exemplary embodiment, in at least one of a plurality of program loops, the row decoder 224 may apply the program voltage to the selected word line and an additionally selected word line.

The page buffer 225 may be connected to the memory cell array 221 through the plurality of bit lines BL. For example, in a read operation, the page buffer 225 may operate as a sense amplifier that outputs data stored in the memory cell array 221. Alternatively, in a program operation, the page buffer 225 may operate as a write driver that writes desired data to the memory cell array 221.

Figure 3:
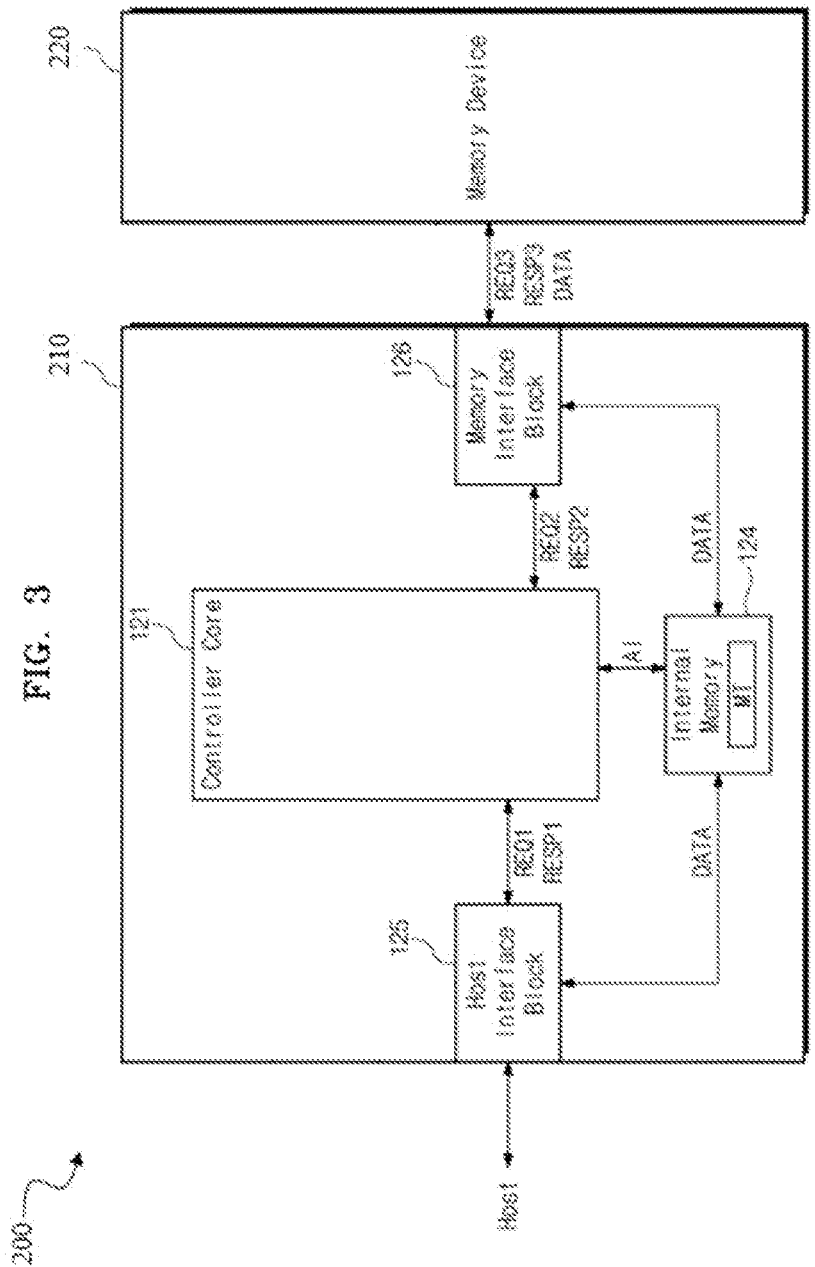
FIG. 3 is a block diagram illustrating the memory system of FIG. 1, according to an exemplary embodiment of the inventive concept.

FIG. 3 is a block diagram illustrating the memory system 200 of FIG. 1, according to an exemplary embodiment of the inventive concept.

Referring to FIG. 3, the memory system 200 includes the memory device 220 and the memory controller 210. The memory controller 210 may also be referred to herein as a controller circuit. The memory device 220 may perform a write operation, a read operation, or an erase operation under control of the memory controller 210.

The memory controller 210 may control the memory device 220 depending on a request received from the host 100 or an internally designated schedule. The memory controller 210 may include a controller core 121, an internal memory 124, a host interface block 125, and a memory interface block 126.

The controller core 121 may control and access the memory device 220 depending on a request received from the host 100 or an internally designated schedule. The controller core 121 may manage and execute various metadata and codes used to manage or operate the memory system 200. In an exemplary embodiment of the inventive concept, the controller core 121 includes an error correction code (ECC) circuit to perform error detection and correction on data read from memory cells of the memory device 220. For example, controller core 121 may sense read voltages from a subset of the memory cells in response to a read command and address information received from a Host, convert the read voltages into a codeword (including data and redundancy information), and perform an error correction code (ECC) decoding operation on the codeword using an ECC decoder.

According to an exemplary embodiment of the inventive concept, for each page of the memory device, the controller core 121 initially computes a channel distribution for each page of the memory device 220, and then later, in response to a read command for a given page, the controller core 121 calculates threshold voltages and a log-likelihood ratio (LLR) table for the given page using the corresponding channel distribution and the required decoding scheme (e.g., hard decoding or soft decoding), and then reads data from the page using the calculated threshold voltages and the LLR table.

The internal memory 124 may be used, for example, as a system memory which is used by the controller core 121, a cache memory which stores data of the memory device 220, or a buffer memory which temporarily stores data between the host 100 and the memory device 220. The internal memory 124 may additionally store a mapping table MT that indicates a relationship between logical addresses from the Host 100 assigned to the memory system 200 and physical addresses of the memory device 220. The internal memory 124 may include, for example, a dynamic random access memory (DRAM) or a static random access memory (SRAM). The internal memory 124 may be a buffer.

In an exemplary embodiment, a level assignment where two immediately adjacent levels both have a high cell count relative to the other levels is likely to have more errors than a level assignment where those two levels with high cell counts are kept as far apart from one another as possible.

The host interface block 125 may include a component for communicating with the host 100 such as, for example, a physical block. The memory interface block 126 may include a component for communicating with the memory device 220 such as, for example, a physical block.

The host interface block 125 may provide the controller core 121 with a first request REQ1 received from the host 100. The first request REQ1 may include a command (e.g., a read command or a write command) and a logical address. The controller core 121 may translate the first request REQ1 to a second request REQ2 suitable for the memory device 220.

For example, the controller core 121 may translate a format of the command. The controller core 121 may obtain address information AI with reference to the mapping table MT stored in the internal memory 124. The controller core 121 may translate a logical address to a physical address of the memory device 220 by using the address information AI. The controller core 121 may provide the second request REQ2 suitable for the memory device 220 to the memory interface block 126.

The memory interface block 126 may register the second request REQ2 from the controller core 121 at a queue. The memory interface block 126 may transmit a request that is first registered at the queue to the memory device 220 as a third request REQ3.

When the first request REQ1 is a write request, the host interface block 125 may write data received from the host 100 to the internal memory 124. When the third request REQ3 is a write request, the memory interface block 126 may transmit data stored in the internal memory 124 to the memory device 220.

When data is completely written, the memory device 220 may transmit a third response RESP3 to the memory interface block 126. In response to the third response RESP3, the memory interface block 126 may provide the controller core 121 with a second response RESP2 indicating that the data is completely written.

After the data is stored in the internal memory 124 or after the second response RESP2 is received, the controller core 121 may transmit a first response RESP1 indicating that the request is completed to the host 100 through the host interface block 125.

When the first request REQ1 is a read request, the read request may be transmitted to the memory device 220 through the second request REQ2 and the third request REQ3. The memory interface block 126 may store data received from the memory device 220 in the internal memory 124. When data is completely transmitted, the memory device 220 may transmit the third response RESP3 to the memory interface block 126.

As the third response RESP3 is received, the memory interface block 126 may provide the controller core 121 with the second response RESP2 indicating that the data is completely stored. As the second response RESP2 is received, the controller core 121 may transmit the first response RESP1 to the host 100 through the host interface block 125.

The host interface block 125 may transmit data stored in the internal memory 124 to the host 100. In an exemplary embodiment, in the case in which data corresponding to the first request REQ1 is stored in the internal memory 124, the transmission of the second request REQ2 and the third request REQ3 may be omitted.

Figure 5:
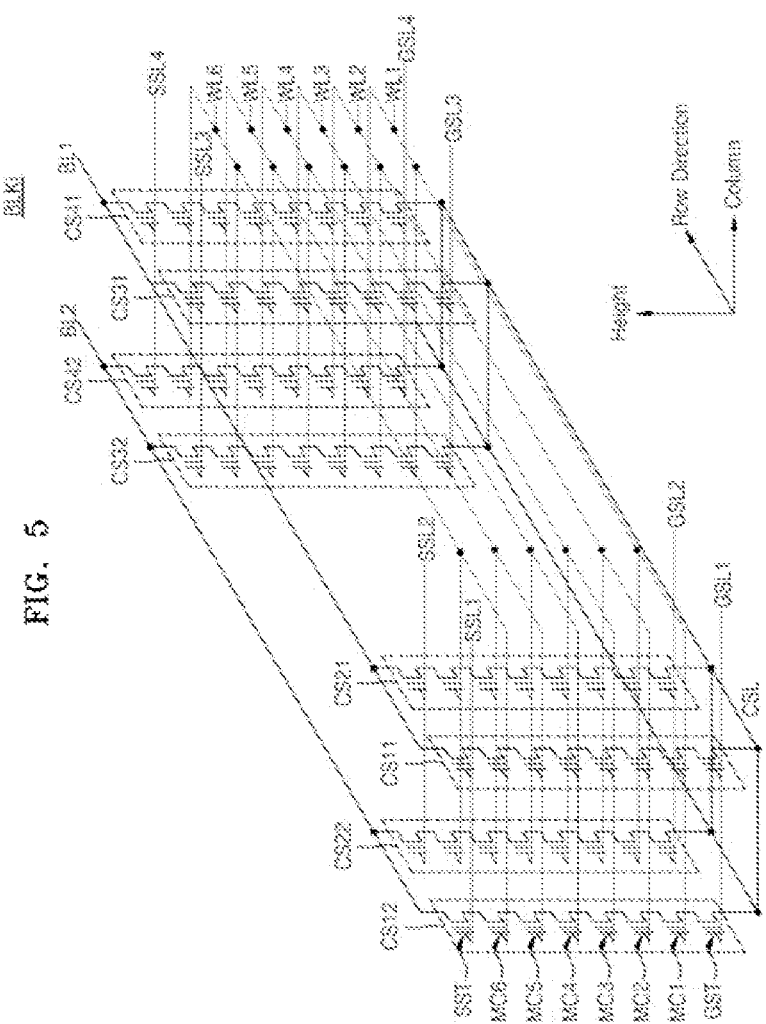
FIG. 5 is a circuit diagram of a memory block of FIG. 4 according to an exemplary embodiment of the inventive concept.

FIGS. 4 and 5 illustrate an example in which the memory system 200 is implemented using a three-dimensional flash memory. The three-dimensional flash memory may include three-dimensional (e.g., vertical) NAND (e.g., VNAND) memory cells. An implementation of the memory cell array 221 including three-dimensional memory cells is described below. Each of the memory cells described below may be a NAND memory cell.

FIG. 4 is a block diagram of the memory cell array 221 of FIG. 2, according to an exemplary embodiment of the inventive concept.

Referring to FIG. 4, the memory cell array 221 according to an exemplary embodiment includes a plurality of memory blocks BLK1 to BLKz. Each of the memory blocks BLK1 to BLKz has a three-dimensional structure (e.g., a vertical structure). For example, each of the memory blocks BLK1 to BLKz may include structures extending in first to third directions. For example, each of the memory blocks BLK1 to BLKz may include a plurality of NAND strings extending in the second direction. The plurality of NAND strings may be provided, for example, in the first to third directions.

Each of the NAND strings is connected to a bit line BL, a string select line SSL, a ground select line GSL, word lines WL, and a common source line CSL. That is, each of the memory blocks BLK1 to BLKz may be connected to a plurality of bit lines BL, a plurality of string select lines SSL, a plurality of ground select lines GSL, a plurality of word lines WL, and a common source line CSL. The memory blocks BLK1 to BLKz will be described in further detail below with reference to FIG. 5.

FIG. 5 is a circuit diagram of a memory block BLKi according to an exemplary embodiment of the inventive concept. FIG. 5 illustrates an example of one of the memory blocks BLK1 to BLKz in the memory cell array 221 of FIG. 4.

The memory block BLKi may include a plurality of cell strings CS11, CS21, CS31, CS41, CS12, CS22, CS32 and CS42. The plurality of cell strings CS11, CS21, CS32, CS41, CS12, CS22, CS32 and CS42 may be arranged in column and row directions to form columns and rows. Each of the cell strings CS11, CS21, CS31, CS41, CS12, CS22, CS32 and CS42 may include a ground select transistor GST, memory cells MC1 to MC6, and a string select transistor SST. The ground select transistor GST, the memory cells MC1 to MC6, and the string select transistor SST, which are included in each of the cell strings CS11, CS21, CS31, CS41, CS12, CS22, CS32 and CS42, may be stacked in a height direction substantially perpendicular to a substrate.

The columns of the plurality of cell strings CS11, CS21, CS31, CS41, CS12, CS22, CS32 and CS42 may be connected to different string select lines SSL1 to SSL4, respectively. For example, the string select transistors SST of the cell strings CS11 and CS12 may be commonly connected to the string select line SSL1. The string select transistors SST of the cell strings CS21 and CS22 may be commonly connected to the string select line SSL2. The string select transistors SST of the cell strings CS31 and CS32 may be commonly connected to the string select line SSL3. The string select transistors SST of the cell strings CS41 and CS42 may be commonly connected to the string select line SSL4.

The rows of the plurality of cell strings CS11, CS21, CS31, CS41, CS12, CS22, CS32 and CS42 may be connected to different bit lines BL1 and BL2, respectively. For example, the string select transistors SST of the cell strings CS11, CS21, CS31 and CS41 may be commonly connected to the bit line BL1. The string select transistors SST of the cell strings CS12, CS22, CS32 and CS42 may be commonly connected to the bit line BL2.

The columns of the plurality of cell strings CS11, CS21, CS31, CS41 and CS12, CS22, CS32 and CS42 may be connected to different ground select lines GSL1 to GSL4, respectively. For example, the ground select transistors GST of the cell strings CS11 and CS12 may be commonly connected to the ground select line GSL1.

The ground select transistors GST of the cell strings CS21 and CS22 may be commonly connected to the ground select line GSL2. The ground select transistors GST of the cell strings CS31 and CS32 may be commonly connected to the ground select line GSL3. The ground select transistors GST of the cell strings CS41 and CS42 may be commonly connected to the ground select line GSL4.

The plurality of memory cells disposed at the same height from the substrate (or the ground select transistors GST) may be commonly connected to a single word line, and the memory cells disposed at different heights from the substrate may be connected to different word lines WL1 to WL6, respectively. For example, the plurality of memory cells MC1 may be commonly connected to the word line WL1. The plurality of memory cells MC2 may be commonly connected to the word line WL2. The plurality of memory cells MC3 may be commonly connected to the word line WL3. The plurality of memory cells MC4 may be commonly connected to the word line WL4. The plurality of memory cells MC5 may be commonly connected to the word line WL5. The plurality of memory cells MC6 may be commonly connected to the word line WL6. The ground select transistors GST of the cell strings CS11, CS21, CS31, CS41 and CS12, CS22, CS32 and CS42 may be commonly connected to the common source line CSL.

Each word-line (e.g., WL1, WL2, etc.) of FIG. 5 may include one page or several pages. For single level cell (SLC), each word-line includes one page and each of the memory cells connected to the word-line store one bit. For a multi-level cell (MLC), each word-line includes two pages, namely a least significant bit (LSB) page and a most significant bit (MSB) page, and each of the memory cells connected to the word-line store two bits. When the given memory cell is a tri-level cell (TLC), each word-line includes three pages, namely the LSB page, a center significant bit (CSB), and the MSB page, and each of the memory cells connected to the word-line store three bits.

Figure 6:
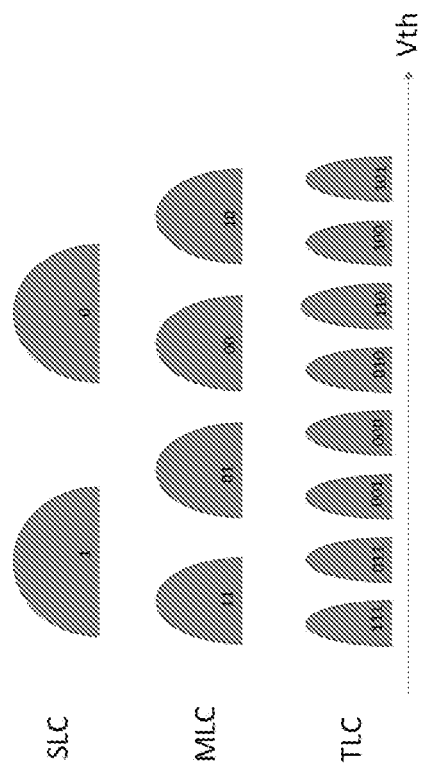
FIG. 6 illustrates exemplary balance gray code mapping for SLC, MLC, and TLC.

In FIG. 6, the mappings of bits to cell voltage level are shown for SLC, MLC, and TLC. For example, an TLC memory cell is interpreted as bits 111 if its voltage Vth is less than a first voltage, is interpreted as bits 011 if its voltage Vth is between the first voltage and a second voltage, is interpreted as bits 001 if its voltage Vth is between the second voltage and a third voltage, etc. In flash memory, the mapping from bits to voltage levels are based on Balanced Gray Code (BGC). For example, each chunk of information of data may be 4 kilobytes (KB), 16 KB, etc. and stored in pages with some additional overhead bits. The reading process in Flash memory is done by setting voltage thresholds (i.e., read thresholds) to read the bits of the desired page. Each page can be decoded using hard decoding (HD) or soft decoding (SD).

Figure 7:
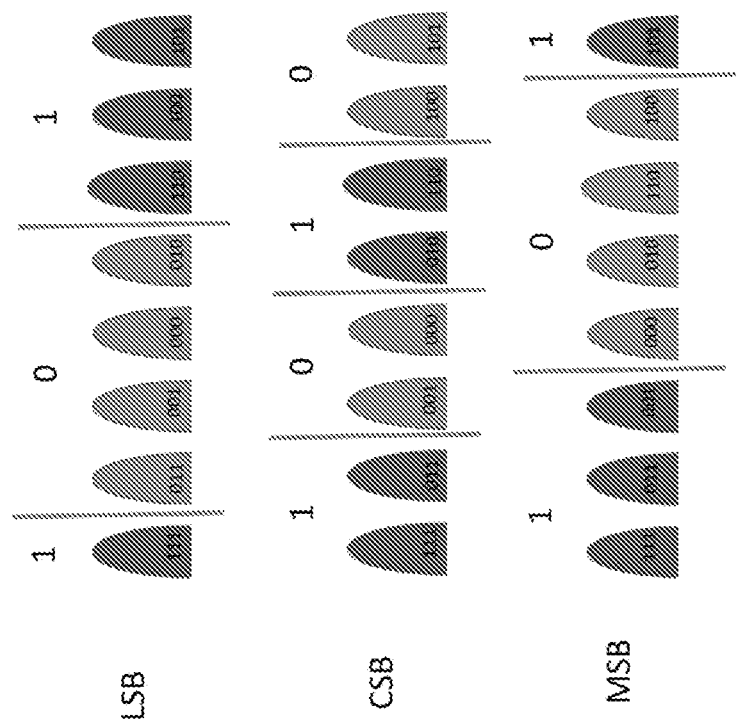
FIG. 7 illustrates exemplary hard decision threshold settings for TLC.
Figure 8:
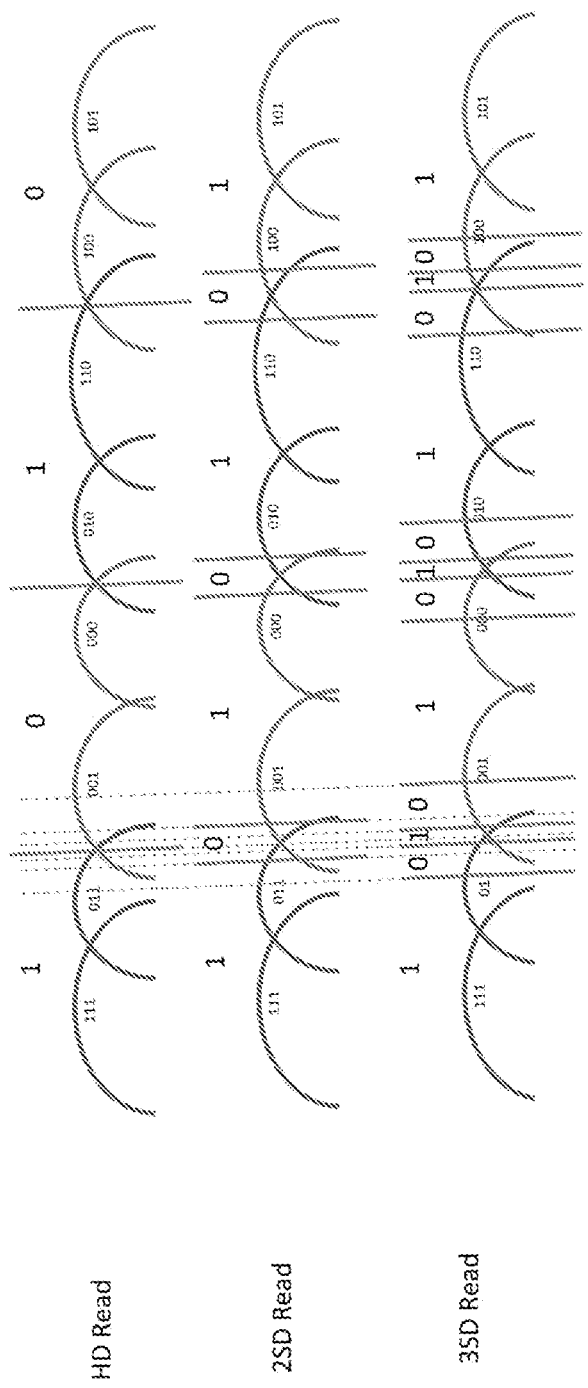
FIG. 8 illustrates exemplary soft decision (SD) threshold settings for TLC.

In HD, there is one threshold for each change between '0' to '1' as shown in FIG. 7 for TLC. For example, the LSB page has two thresholds, the CSB page has three thresholds, and the MSB page has two thresholds. In SD, there are additional thresholds for each HD threshold as shown in FIG. 8. In 2SD (2-bit soft decision), there are two additional thresholds for each HD threshold, overall $2^2=4$ decision regions around each HD thresholds. In 3SD (3-bit soft decision), there are 6 additional thresholds for each HD threshold, namely $2^3=8$ decision regions around the HD thresholds. For example, a total number of the thresholds (i.e., read thresholds) may be determined based on a decoding scheme, a type of the desired page, and a mapping from bits to voltage levels.

An embodiment of the inventive concept provides an optimal end-to-end solution for reading the cell voltage of a memory cell to an input of the ECC decoder. The embodiment is optimal in the sense that it maximizes Mutual Information (MI), which may be used as a measurement to maximize communication capacity and storage capacity.

Figure 9:
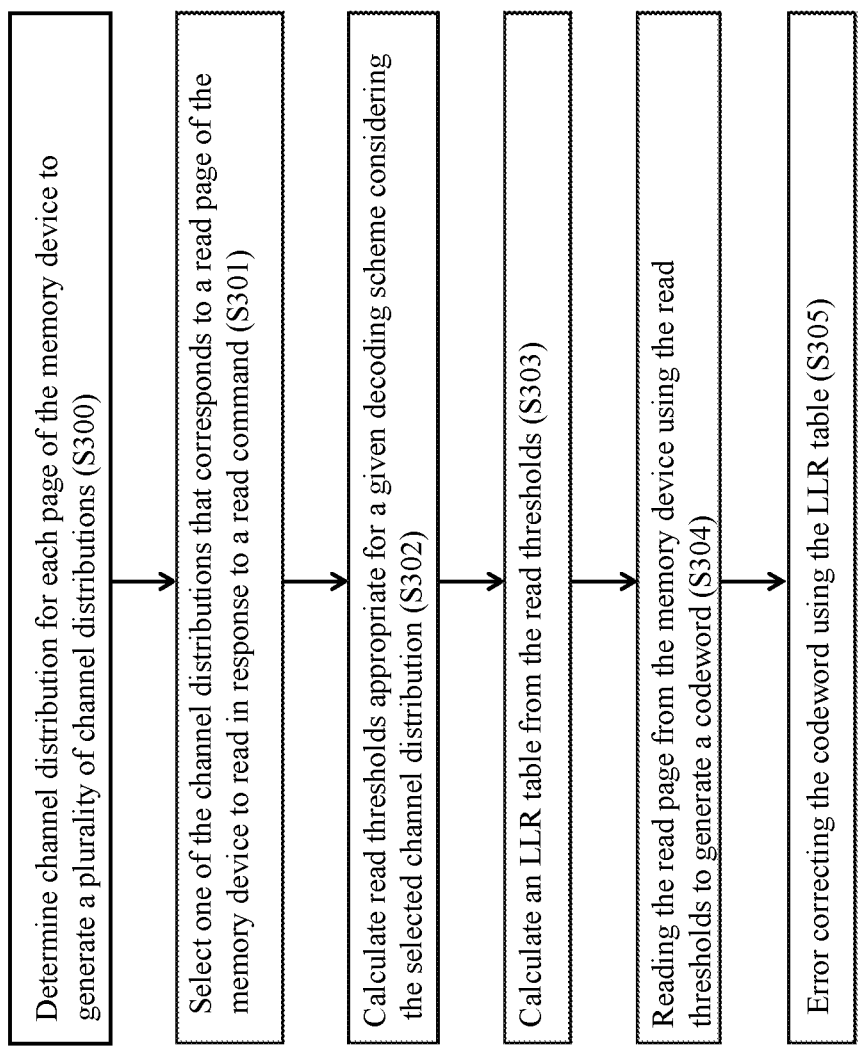
FIG. 9 illustrates a method of reading data from a memory device according to an exemplary embodiment of the inventive concept.

FIG. 9 illustrates a method of reading data from the memory device according to an exemplary embodiment of the inventive concept. The method may be performed by the memory controller 210 and/or the controller core 121.

The method of FIG. 9 includes determining a channel distribution for each page of the memory device 220 to generate a plurality of channel distributions (S300). The channel distribution P (y|b) includes M values, where y is the cell voltage of the page, b is stored data with a value of 0 or 1 and M is a positive integer greater than 0 determined based on the chosen voltage resolution (e.g., 20 mv) and the range of possible read voltages (e.g., −2 v to 4 v). For example, when the voltage range is −2 v to 4 v and the voltage resolution is 20 mv, there would be 300 discrete voltages between the voltage range and M would be 300. The M values indicates the probabilities that each of the discrete voltages is set to '1' (i.e., b=1) and the probabilities that each of the discrete voltages is set to '0' (i.e., b=0). For example, if the memory device 220 include N word-lines and the memory device 220 is a TLC, then there would be 3*N pages and thus 3*N channel distributions.

In an embodiment, a classifier operates on characteristics of each of the 3×N pages to estimate each corresponding channel distribution. In an embodiment, the characteristics for a given page of the 3×N pages is the page type (e.g., $N_{page}=3$ in TLC since there is an LSB, a CSB, and MSB), a page number of the given page (e.g., $N_{loc}$), an endurance amount such as a program/erase (P/E) count (e.g., $N_{P/E}$) associated with the given page, and a retention time (e.g., $N_{ret}$) associated with the given page, but is not limited thereto. For example, one of the above-identified characteristics may be omitted. The page number may indicate a physical region in a certain block of the memory device 220. For example, if there are 100 TLC memory cells in a page having the page number, then each type of page has a size of 100 bits. The retention time may indicate a value associated with a given page indicating a time since the given page was last written. Thus, overall, there are $N_{ch\text{-}type}=N_{page} \times N_{loc} \times N_{P/E} \times N_{ret}$ types of channels or channel distributions. The estimated channel of a given page may be used to find the optimal read thresholds appropriate for a required decoding scheme (e.g., HD or SD).

The estimation of the channel distributions may be performed in an offline manner. For example, the generation may occur just after the memory system 200 is powered on and before it is written with new data or read from. The estimation may be referred to as an initial channel estimation.

Later, an adaptive channel estimation scheme may be performed to update the channel distributions since the electrical characteristics of non-volatile memory such as flash memory changes over time due to several reasons such as P/E cycles (endurance) and retention time.

In an embodiment, the adaptive scheme uses data that extracted correctly from a specific page to update the channel distribution. For a page that was read correctly using the calculated read thresholds, the data stored therein is known and can be used to improve the corresponding channel distribution for future reads. The adaptive channel estimation can be performed as part of a low priority process after the read process. The adaptive channel estimation may include saving the data after a successful page read, setting the read thresholds according to the desired voltage resolution, getting the cell voltage levels for all word-lines, estimating the channel distribution of the successful page, and updating the estimated channel distribution. For example, if a page has 100 TLC memory cells and the page has been successfully read, one can statistically update P (y|b=0) and P (y|b=1) based on the actual read voltage level of each of the 100 cells. For 100 cells, one could have approximately 50 with b=0 and 50 with b=1. The channel estimation could then be updated based on the updated P (y|b=0) and P (y|b=1).

The method of FIG. 9 further includes selecting one of the channel distributions that corresponds to a read page of the memory to be read in response to a read command for the read page (S301). For example, the read command may be received along with a read address indicating a word-line location of the memory device 220 to be read, the memory system 200 may store information indicating the number of bits of data stored by each page at the word-line location, the P/E count of each page, and the retention time of each page; and then the type of the channel distribution can be determined from the word-line location, the number of bits, the P/E count, and the retention time. Then a channel distribution can be selected from previously estimated channel distributions that matches the determined type.

The method of FIG. 9 further includes calculating read thresholds appropriate for a given decoding scheme (e.g., HD, SD (e.g., 2SD, 3SD), etc.) considering the selected channel distribution (S302). Next, a Log-Likelihood Ratio (LLR) table may be calculated from the read thresholds (S303). Then, the read page can be read from the memory device using the read thresholds to generate a codeword (S304), and the codeword can be error corrected using the LLR table (S305).

A threshold calculator of the controller core 121 may be used to find the optimal read thresholds. The threshold calculator may be implemented offline or in real time. The memory controller 210 or the controller core 121 may quantize the cell voltage read from a page of the memory device 220 according to the read thresholds computed by the threshold calculator. The result of the quantization may be referred to as Z and has K distinct values (symbols). For example, K=2 for HD, K=4 for 2SD and K=8 for 3SD. Then Z may be mapped to a Log-Likelihood Ratio (LLR).

Figure 10:
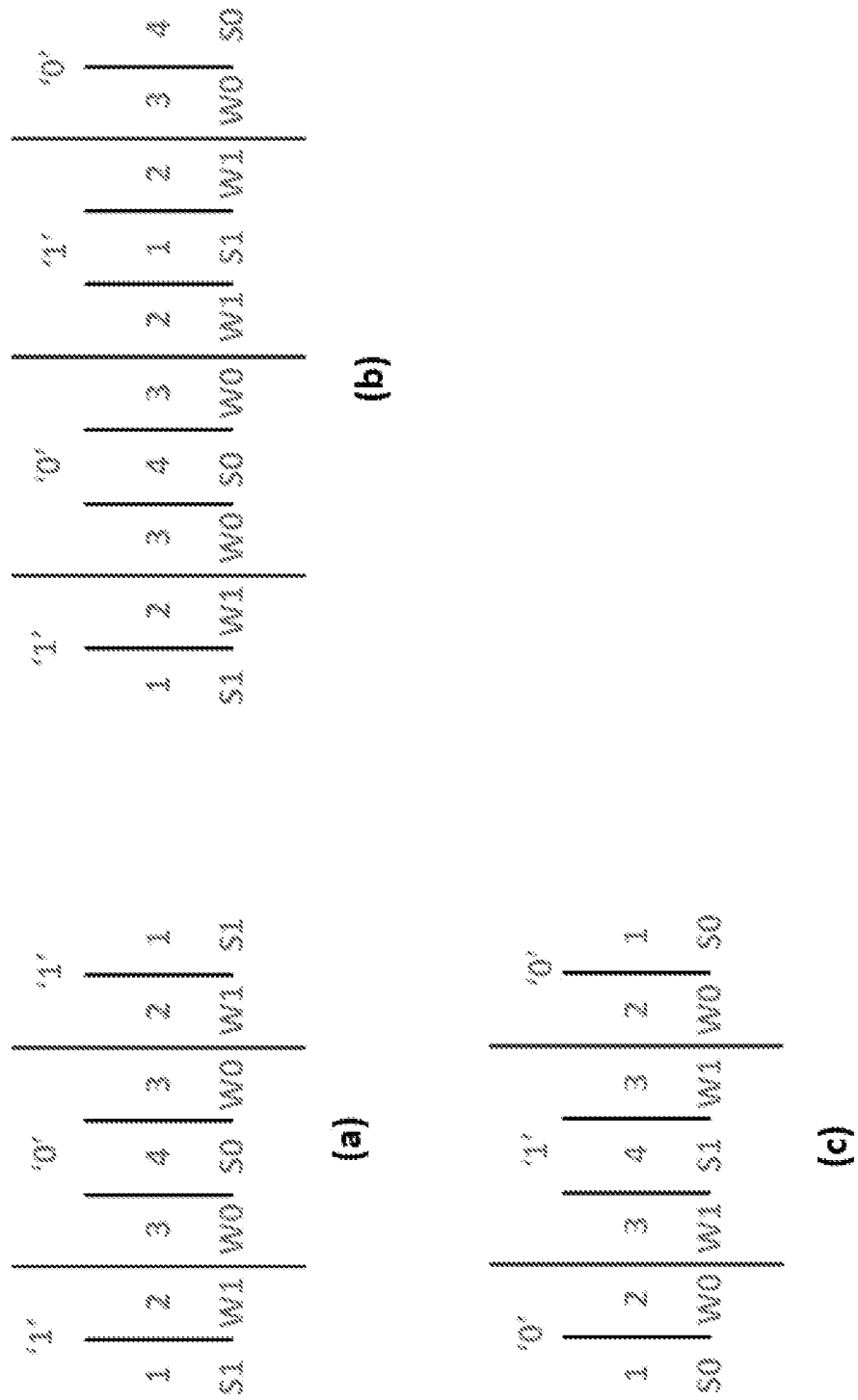
FIG. 10 illustrates exemplary TLC thresholds when 2SD is used for various pages.

FIG. 10 illustrates 2SD decoding when memory cells are TLC. Part (a) of FIG. 10 shows a TLC with 2SD for an LSB page, part (b) of FIG. 10 shows a TLC with 2SD for a CSB page, and part (c) of FIG. 10 shows a TLC with 2SD for a MSB page. The lines in FIG. 10 are thresholds and the regions between the lines are decision regions. The longer lines are the HD thresholds and the shorter lines are the SD thresholds. When a read voltage falls in the S1 (strong '1') region, it has high confidence that the corresponding value is '1'. When a read voltage falls in the S0 (strong '0') region, it has high confidence that the corresponding value is '0'. When a read voltage falls in the W1 (weak '1') region, it has low confidence that the corresponding value is '1'. When a read voltage falls in the W0 (weak '0') region, it has low confidence that the corresponding value is '0'. The thresholds (HD thresholds) with the longer lines distinguish between a decision of zero and one. Each interval (e.g., the above S1 region, S0 region, W1 region and W0 region, etc.) appears one or is repeated twice in the MSB/LSB page and is repeated two or three times in the CSB page.

The optimal thresholds for each page may be determined by use of a Trellis diagram, where for example, two or three thresholds are set simultaneously at each stage of the Trellis diagram. A dynamic programming technique may find the optimal path through the Trellis diagram which presents the optimal threshold settings. The technique maximizes the mutual information I(b; Z). The maximization problem is defined by Equation 1, $$I_{max}(K) = \max_{t} I(b; Z) = \max_{t} \sum_{z=1}^{K} \sum_{b \in \{0,1\}} p(b) \sum_{y \in \pi_z(t_z, t_{z+1})} p(y|b) \log \left( \frac{\sum_{y' \in \pi_z(t_z, t_{z+1})} p(y'|b)}{\sum_{y' \in \pi_z(t_z, t_{z+1})} p(y')} \right) \quad [1]$$

where $\Pi_z(t_z, t_{z+1})$ is a rectangular function which defines intervals for MSB and LSB pages with BGC mapping. The intervals $t_z$, $t_{z+1}$ where $t_z$ are the set of thresholds in stage z and $t_{z+1}$ are a set of thresholds at stage z+1 may be determined, since these thresholds define the interval that is mapped to output symbol z. We define the function Z=G(u) as an interval mapped to Z. For each output symbol Z and for different mapping function G(u) the rectangular mapping $\Pi_z(\cdot)$ is different. This rectangular mapping is many to one, that is several intervals are mapped to quantized output symbol Z. Meanwhile, y represents the channel output. In other words, y is modelling the cell voltage. Also, u is a parameter that enumerates the intervals separated by the read thresholds of the cell voltage.

The optimization searches for thresholds t, an optimal partition of the voltage axis that maximizes the mutual information. The inner summation is defined by Equation 2, $$i(t_z, t_{z+1}) = \sum_{b \in \{0,1\}} p(b) \sum_{y \in \pi_z(t_z, t_{z+1})} p(y|b) \log_2 \left( \frac{\sum_{y' \in \pi_z(t_z, t_{z+1})} p(y'|b)}{\sum_{y' \in \pi_z(t_z, t_{z+1})} p(y')} \right). \quad [2]$$

The maximization is defined by searching optimal t using a plurality of thresholds, as defined by Equation 1, $$I_{max}(K) = \max_{t} \sum_{z=1}^{K} i(t_z, t_{z+1}). \quad [3]$$

The optimal solution can be found by searching over the Trellis diagram.

Figure 11:
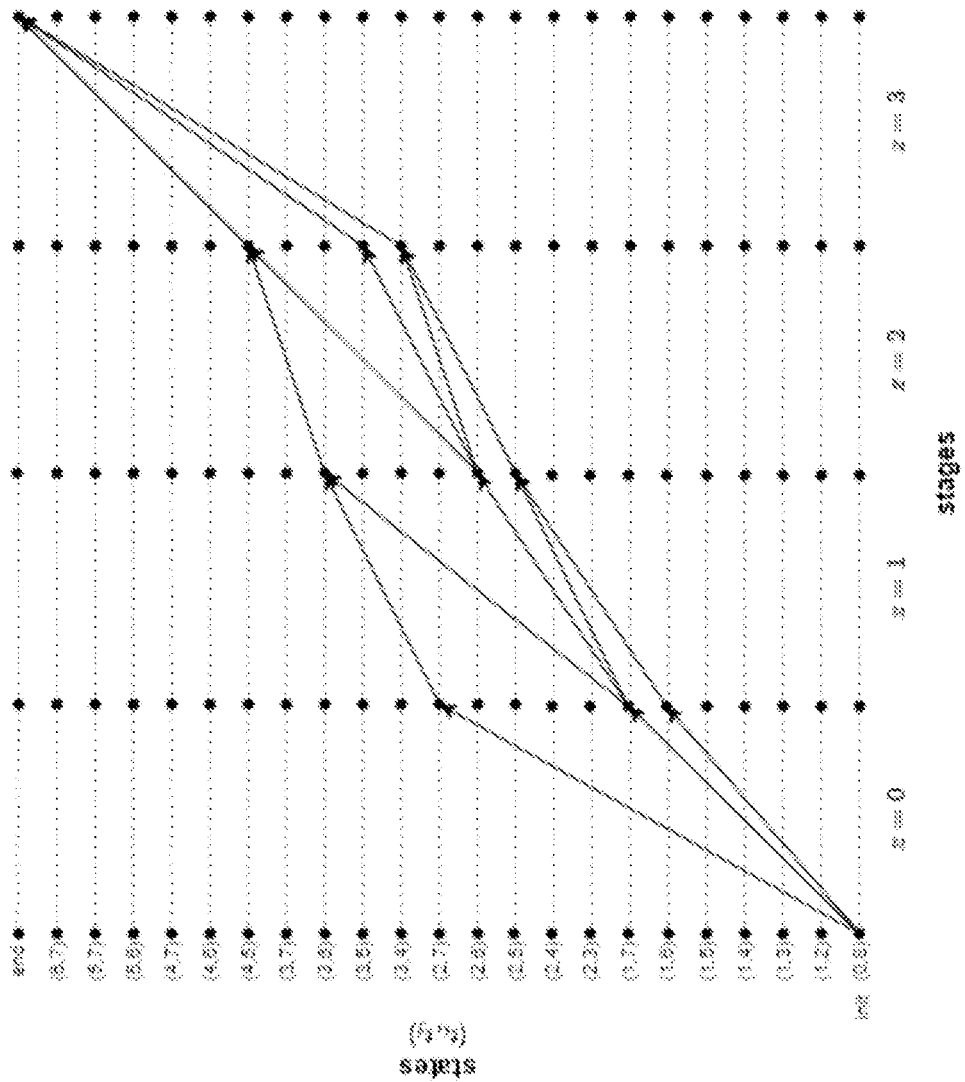
FIG. 11 illustrates generation of a Trellis diagram according to an exemplary embodiment of the inventive concept.

FIG. 11 illustrates a Trellis diagram to show the possible paths through the candidate nodes. The Trellis diagram is shown for input size equal to M=8. The Trellis diagram include multiple stages, where each stage contains input states and output states for computing all options for the first output symbol. For example, a number of stages of the Trellis diagram may be determined based on a decoding scheme and a type of the read page. The stages are indicated by T=(t_1, t_2), where t_1, t_2 are the threshold locations in y. The optimal thresholds may be determined based on the Trellis diagram by using a dynamic programming technique such as a Viterbi algorithm. The Viterbi algorithm maximizes the term I(b; Z). For M>>1 and LSB/MSB, the number of states in each stage is all possible ways for setting two thresholds at the channel output which is approximately MP/2 states.

Figure 12:
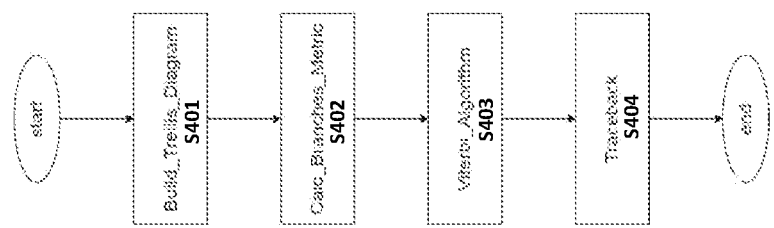
FIG. 12 illustrates a procedure for calculating the optimal thresholds, according to an exemplary embodiment of the inventive concept.

FIG. 12 illustrates a procedure for calculating the optimal thresholds, according to an embodiment of the disclosure.

The method of FIG. 12 includes building a Trellis diagram (Bulid_Trellis_Diagram) (S401). In an exemplary embodiment, a Trellis diagram may be created or generated based on a decoding scheme and a type of a page. A different Trellis diagram may be created for each different type of page. For example, there may be a first build function for building a Trellis diagram for a LSB page, a second build function for building a Trellis diagram for a CSB page, and a third build function for building a Trellis diagram for a MSB page. Each build function considers the number of states, the number of output symbol K, the page number, and the number of bits per memory cell. The build function may consider the size of y or the voltage axis fine resolution such as 20 mv, the number of symbols K at the output, the page type, the number of bits per memory cell (e.g., TLC is three bits per cell, a Quad-Level Cell (QLC) is fourth bits per cell). The output of the function is the Trellis structure that includes all states, stages, and branches. The branches hold the input and output states that are connected as shown in FIG. 11 for TLC with 2DS and M=8.

The method of FIG. 12 further includes calculating the branch metrics from branches of the Trellis diagram (Calc_Branches_Metric) (S402). Each branch is a connection between an input state and an output state. Step S402 may be performed by a function that calculates an associated metric for each branch in the Trellis diagram using Equation 2 for a given mapping function G (u).

The method of FIG. 12 further includes determining an optimal path through nodes of the Trellis diagram using a Viterbi algorithm and the branch metrics (Viterbi_Algorithm) (S403).

The method of FIG. 12 further includes performing a traceback operation on the optimal path to generate the optimal thresholds and mutual information (Traceback) (S404). The traceback function runs backwards over the winning path to extract the optimal thresholds and the mutual information.

Figure 13B:
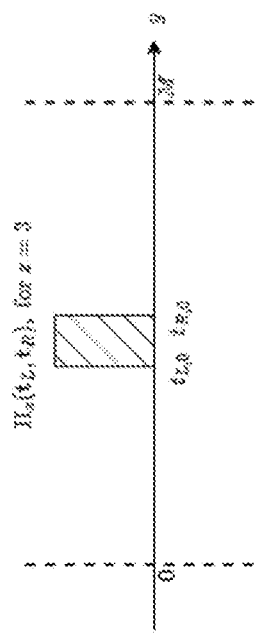
Figure 13C:
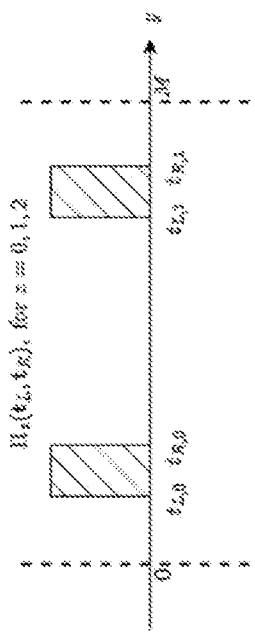

A function for computing a branch metric may compute the partial mutual information i(t_L,t_R) as shown in equation 2 for all possible options of thresholds t_L, t_R over all edges in a Trellis diagram. Each branch metric consists of several intervals, t_L and t_R are vectors that hold the lower (left) thresholds and the upper (right) thresholds of all intervals, respectively. In FIG. 13B and FIG. 13C, the branch metric computation of MSB or LSB pages in TLC for 2SD is demonstrated. There are two types of branch metric computations in this example: (i) for stages 0, 1, 2 as shown in FIG. 13C, and (ii) for stage 3 as shown in FIG. 13B. In this example, for stages 0, 1, 2 there are two intervals in the branch metric computations, thus t_L, t_R are vectors of size two. For stage 3 there is a single interval, thus t_L, t_R are scalars.

FIG. 13A illustrates a method of calculating the read threshold voltages for TLC for a MSB page or an LSB page with 2SD decoding according to an exemplary embodiment of the disclosure. The method is performed in stages. At each stage after stage 0, two thresholds, namely a lower threshold and an upper threshold, are chosen together as candidates. The method may be operated on a corresponding page based on the number of thresholds available for that page according to the decoding scheme. Since, the MSB page and the LSB page include 6 thresholds for 2SD, FIG. 13A applies to the MSB page and the LSB page. In the first stage (stage 1), the first lower threshold and the first upper threshold are chosen within the available voltage range (e.g., −2 v to 4 v); in the second stage (stage 2), the second lower threshold and the second upper threshold are chosen between the first lower threshold and the first upper threshold, and a corresponding first branch metric among a plurality of first branch metrics is calculated from the first lower threshold, the first upper threshold, the second lower threshold and the second upper threshold. A first node may be represented by the first lower threshold and the first upper threshold, a second node may be represented by the second lower threshold and the second upper threshold, and line connecting the first and second nodes maybe referred to as a corresponding first branch (or edge) among a plurality of first branches. The first stage and the second stage may be re-executed for all possible combinations to generate the remaining first branches and the remaining first branch metrics.

Next, in the third stage (stage 3), the third lower threshold and the third upper threshold are chosen between the second lower threshold and the second upper threshold, and a corresponding second branch metric among a plurality of second branch metrics is calculated from the second lower threshold, the second upper threshold, the third lower threshold and the third upper threshold. A third node may be represented by the third lower threshold and the third upper threshold and line connecting the second and third nodes maybe referred to as a corresponding second branch among a plurality of second branches. The second stage and the third stage may be re-executed for all possible combinations to generate the remaining second branches and the remaining second branch metrics.

Lastly, in the fourth stage (stage 4), a final path is chosen through the nodes based on all the branch metrics to determine the optimal read thresholds.

Figure 14:
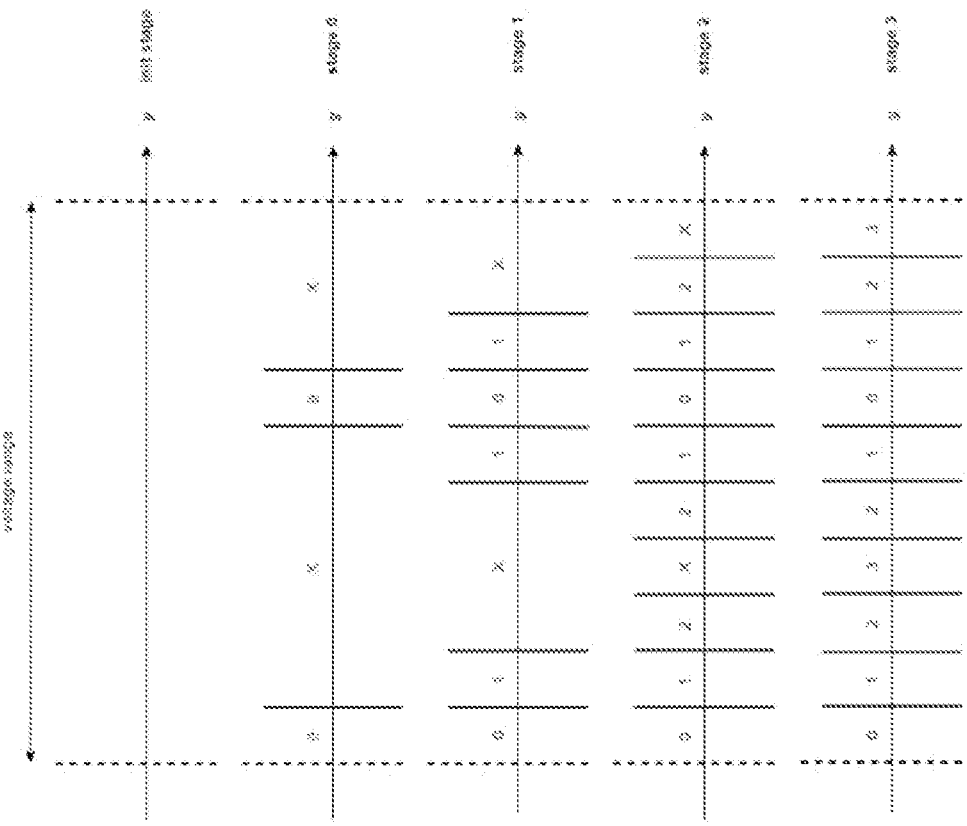
FIG. 14 illustrates a method of calculating the optimal thresholds according to an exemplary embodiment of the inventive concept.

FIG. 14 illustrates a method of calculating the read threshold voltages for TLC for a CSB page with 2SD decoding according to an exemplary embodiment of the disclosure. The method is performed in stages. At each stage after init stage, three thresholds, namely a lower threshold, an upper threshold, and middle threshold between the upper and lower thresholds are chosen together as candidates. The method may be operated on a corresponding page based on the number of thresholds available for that page according to the decoding scheme. Since, the CSB page includes 9 thresholds for 2SD, FIG. 14 applies to the CSB page. In the first stage (stage 0), the first lower, middle, and upper threshold are chosen within the available voltage range (e.g., −2 v to 4 v); in the second stage (stage 1), the second lower and middle thresholds are chosen between the first lower and middle thresholds, the second upper threshold is chosen above the first upper threshold, and a corresponding first branch metric among a plurality of first branch metrics is calculated from the plurality of first thresholds (i.e., the first lower threshold, the first middle threshold and the first upper threshold) and the plurality of second thresholds (i.e., the second lower threshold, the second middle threshold and the second upper threshold). A first node may be represented by the plurality of first thresholds, a second node may be represented by the plurality of second thresholds, and line connecting the first and second nodes maybe referred to as a corresponding first branch (or edge) among a plurality of first branches. The first stage and the second stage may be re-executed for all possible combinations to generate the remaining first branches and the remaining first branch metrics.

Next, in the third stage (stage 2), the third lower and middle thresholds are chosen between the second lower and middle thresholds, the third upper threshold is chosen above the second upper threshold, and a corresponding second branch metric among a plurality of second branch metrics is calculated from the plurality of second thresholds and the plurality of third thresholds (i.e., the third lower threshold, the third middle threshold and the third upper threshold). A third node may be represented by the plurality of third thresholds and a line connecting the second and third nodes maybe referred to as a corresponding second branch among a plurality of second branches. The second stage and the third stage may be re-executed for all possible combinations to generate the remaining second branches and the remaining second branch metrics.

Lastly, in the fourth stage (stage 3), a final path is chosen through the nodes based on all the branch metrics to determine the optimal read thresholds.

The computation of the LLR for the ECC decoder is based on the optimal threshold computation and the estimated channel distribution p (y|b). The relationship of LLR(z) to P(y|b) for P(b=0)=P(b=1)=0.5 is given by Equation 4, $$LLR(z) = \log\left(\frac{P(b=0|z)}{P(b=1|z)}\right) = \log\left(\frac{P(b=0|y \in z)}{P(b=1|y \in z)}\right) = \log\left(\frac{P(y \in z|b=0)}{P(y \in z|b=1)}\right) = \log\left(\frac{\sum_{y \in z} P(y|b=0)}{\sum_{y \in z} P(y|b=1)}\right) \quad [4]$$

The LLR table has K entries and each entry is computed according to Equation 5, $$LLR(z) = \log\left(\frac{\sum_{y \in z} \hat{P}(y|b=0)}{\sum_{y \in z} \hat{P}(y|b=1)}\right), \quad z = 0, 1, 2, \ldots, K-1 \quad [5]$$

where $\hat{P}(y|b)$ is the estimated channel probability and the summations is over all y's that belong to z. The y's that belong to z is determined by the previous calculated optimal thresholds.

An example of finding the optimal thresholds using the Trellis diagram of FIG. 11 and the LLR table is provided.

In this example, it is assumed that thresholds are being set for a MSB page for 2SD decoding (e.g., K=4), and M=8 (e.g., the number of values of the channel output Y). The conditional channel probability according to Table 1 is assumed.

TABLE 1

| P(y|b) | y = 0 | y = 1 | y = 2 | y = 3 | y = 4 | y = 5 | y = 6 | y = 7 |
|---|---|---|---|---|---|---|---|---|
| b = 0 | 0.5 | 0.25 | 0.125 | 0.05 | 0.04 | 0.02 | 0.01 | 0.005 |
| b = 1 | 0.005 | 0.01 | 0.02 | 0.04 | 0.05 | 0.125 | 0.25 | 0.5 |

The channel output (8 values) is enumerated as values between 0, 1, 2, . . . , 7. The stored data is b that has two values 0, 1. Table 1 is read as follows: the probability that y=0 given that b=0 is 0.5, the probability that y=1 given that b=0 is 0.25 and so on. Each row is summed to one, which is due to probability rules. It is assumed that the stored bit (b) has uniform probability as shown by Table 2.

TABLE 2

|  | b = 0 | b = 1 |
|---|---|---|
| P(b) | 0.5 | 0.5 |

According to probability rules, P(y)=$\Sigma_b$p(b)P(y|b)=p(b=0)p(y|b=0)+p(b=1)p(y|b=1), and thus P(y) is given by Table 3.

TABLE 3

| | y = 0 | y = 1 | y = 2 | y = 3 | y = 4 | y = 5 | y = 6 | y = 7 |
|---|---|---|---|---|---|---|---|---|
| P(y) | 0.2525 | 0.13 | 0.0725 | 0.045 | 0.045 | 0.0725 | 0.13 | 0.2525 |

A branch metric function may calculate all the metrics associated with all edges in the Trellis diagram using Equation 6 based on Equation 2.

$$i((t_1, t_2) \to (t_3, t_4)) = \sum_{b \in \{0,1\}} p(b) \sum_{y \in \pi_z(t_z, t_{z+1})} p(y|b) \log\left(\frac{\sum_{y' \in \pi_z(t_z, t_{z+1})} p(y'|b)}{\sum_{y' \in \pi_z(t_z, t_{z+1})} p(y')}\right). \quad [6]$$

Figure 16:
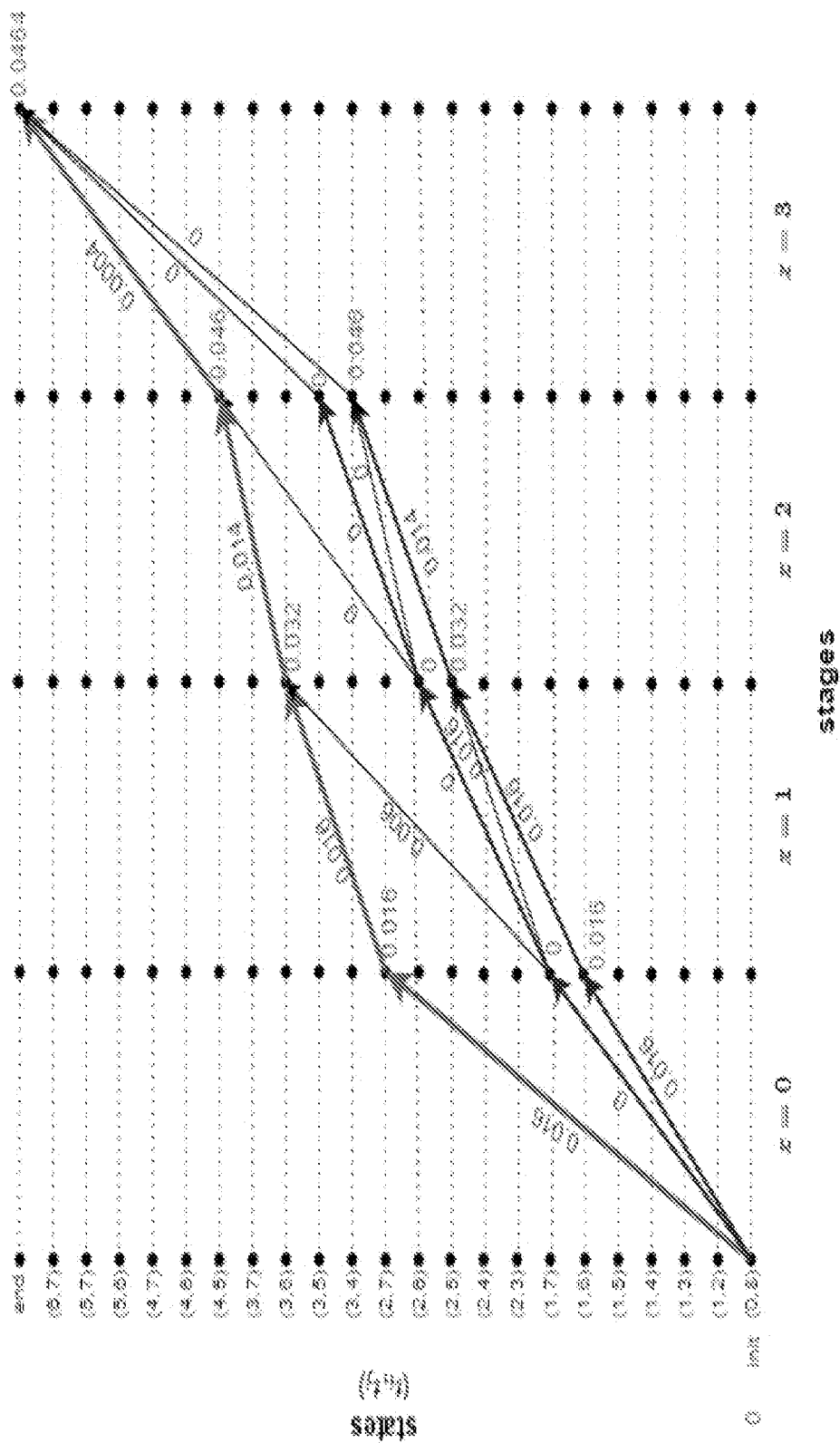
FIG. 16 illustrates results of calculating branch metrics for the Trellis diagram of FIG. 11 according to an exemplary embodiment of the inventive concept.

FIG. 15 illustrates an example of calculating the branch metric of a branch between node (0,8) and node (1,6) using a Viterbi algorithm. The results of calculating all the branch metrics for the Trellis diagram of FIG. 11 is shown in FIG. 16. The Viterbi algorithm starts in an initial state where the accumulated metric is zero. The accumulated metrics (for example, accumulated mutual information) of all nodes are determined. In each branch, the Viterbi algorithm sums the accumulated metrics and the appropriate branch metric. When two or more branches are merged in a node, the path with the maximal value is the accumulated metric and the winning edge is saved. The Viterbi algorithm runs over all stages and states. At the end state, the winning path is determined, and its metric is 0.0464 in the example shown in FIG. 16.

In the traceback of FIG. 16, from the end state one runs backward to the initial state to extract the winning path. In this way, one extracts the optimal thresholds setting. In the example of FIG. 16, the optimal thresholds are: (2,7), (3,6), (4,5) and the final mappings from Y to Z is represented by $$Z = \begin{cases} 0, & y = 0, 1, 7 \\ 1, & y = 2, 6 \\ 2, & y = 3, 5 \\ 3, & y = 4 \end{cases}.$$

The computation of the LLR table using a log with base 2 is performed using Equation 5. FIG. 17 illustrates the LLR table calculated when the optimal thresholds are: (2,7), (3,6), (4,5).

FIG. 18 illustrates exemplary pseudo code for the Viterbi algorithm. The last step in the states loop holds a pointer to the previous state though which a traceback function will extract the winning path, that is the optimal solution. The winning_path variable holds pointers to the previous winning state for all states over all stages. The winning path is the path that survived and reached the last state in the last stage. The winning path is held as a sequence of states over all stages.

In this example, the above-described channel distribution P (y|b) may be estimated offline. The offline estimation may include determining for each page, the number of bits it stores, its page number, its endurance (e.g., number of program/erase cycles) up to a finite resolution, and its retention time up to a finite resolution, then classifying the page according to the determine values.

Figure 19:
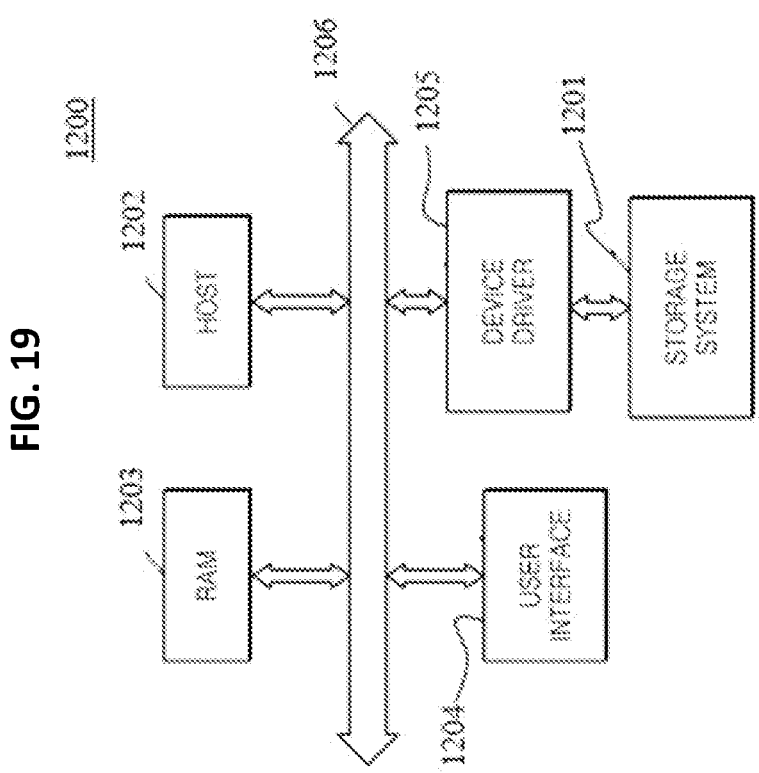
FIG. 19 illustrates is a block diagram of a computing system including a non-volatile memory system, according to an exemplary embodiment of the inventive concept.

FIG. 19 is a block diagram of a computing system 1200 including a non-volatile memory system, according to an exemplary embodiment of the inventive concept.

The non-volatile memory system in FIG. 19 may be the memory system 200 illustrated in FIG. 1. In the computing system 1200, which may be, for example, a mobile device or a desktop computer, the non-volatile memory system may be mounted as a non-volatile storage system 1201, however exemplary embodiments are not limited thereto.

The computing system 1200 may include, for example, a host 1202 including a CPU, a RAM 1203, a user interface 1204, and a device driver 1205. The host 1202 may be the host 100 illustrated in FIG. 1, and the device driver 1205 may be the memory device driver 111 illustrated in FIG. 1. These elements are electrically connected to a bus 1206. The non-volatile storage system 1201 may be connected to the device driver 1205. The host 1202 may control the entire computing system 1200 and perform an operation corresponding to a user command input through the user interface 1204. The RAM 1203 may function as a data memory of the host 1202. The host 1202 may write user data to or read user data from the non-volatile storage system 1201 through the device driver 1205. In FIG. 16, the device driver 1205 that controls the operation and management of the non-volatile storage system 1201 is illustrated as being disposed outside the host 1202, however exemplary embodiments are not limited thereto. For example, in an exemplary embodiment, the device driver 1205 may be disposed inside the host 1202.

In exemplary embodiments of the present inventive concept, a three-dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In exemplary embodiments of the present inventive concept, the 3D memory array includes vertical NAND strings that are vertically oriented such that at least one memory cell is located over another memory cell. The at least one memory cell may include a charge trap layer. The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

As is traditional in the field of the inventive concept, exemplary embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the exemplary embodiments may be physically separated into two or more interacting and discrete blocks, units and/or modules without departing from the scope of the inventive concept. Further, the blocks, units and/or modules of the exemplary embodiments may be physically combined into more complex blocks, units and/or modules without departing from the scope of the inventive concept.

Exemplary embodiments of the present invention may be embodied directly in hardware, in a software module executed by a processor, or in a combination of the two. A software module may be tangibly embodied on a non-transitory program storage device such as, for example, in RAM memory, flash memory, ROM memory, EPROM memory, EEPROM memory, registers, or any other form of storage medium known in the art. An exemplary storage medium may be coupled to the processor, such that the processor can read information from, and write information to, the storage medium. In the alternative, the storage medium may be integral to the processor. Further, in some aspects, the processor and the storage medium may reside in an application specific integrated circuit (ASIC).

While the present inventive concept has been particularly shown and described with reference to the exemplary embodiments thereof, it will be understood by those of ordinary skill in the art that various changes in form and detail may be made therein without departing from the spirit and scope of the present invention as defined by the following claims.

What is claimed is:

1. A memory system, comprising:
 a memory device comprising a plurality of memory cells; and
 a memory controller configured to:
  determine a channel distribution for each page of the memory device to generate a plurality of channel distributions;
  select a channel distribution among the plurality of channel distributions that corresponds to a read page of the memory device to be read in response to a read command;
  generate a Trellis diagram based on a decoding scheme and a type of the read page;
  determine an optimal path through the Trellis diagram using the selected channel distribution according to a dynamic programming algorithm;
  find read thresholds from the optimal path; and
  read the read page from the memory device using the read thresholds.

2. The memory system of claim 1, wherein a total number of the read thresholds is determined based on the decoding scheme, the type of the read page, and a mapping from bits to voltage levels.

3. The memory system of claim 1, wherein a number of stages of the Trellis diagram is determined based on the decoding scheme and the type of the read page.

4. The memory system of claim 3, wherein at each of the stages, the memory controller determines several of the read thresholds simultaneously.

5. The memory system of claim 1, wherein the determining of the optimal path includes calculating accumulated mutual information over the Trellis diagram.

6. The memory system of claim 1, wherein the plurality of channel distributions are initially estimated for each page from a page number of the corresponding page, a program/ erase (P/E) count of the corresponding page, and a retention time of the corresponding page.

7. The memory system of claim 1, wherein the memory controller updates the channel distribution of the read page based on results of a successful previous read of the read page.

8. The memory system of claim 1, wherein the memory controller calculates a log-likelihood ratio using the channel distribution and the read thresholds.

9. The memory system of claim 1, wherein the dynamic programming algorithm is a Viterbi algorithm.

10. A method of reading data from a memory device of a memory system, the method comprising:
determining, by a memory controller of the memory system, a channel distribution for each page of the memory device to generate a plurality of channel distributions;
selecting, by the memory controller, a channel distribution among the plurality of channel distributions that corresponds to a read page of the memory device to be read in response to a read command;
generating, by the memory controller, a Trellis diagram based on a decoding scheme and a type of the read page;
determining, by the memory controller, an optimal path through the Trellis diagram using the selected channel distribution according to a dynamic programming algorithm;
finding, by the memory controller, read thresholds from the optimal path; and
reading, by the memory controller, the read page from the memory device using the read thresholds.

11. The method of claim 10, wherein a total number of the read thresholds is determined based on the decoding scheme, the type of the read page, and a mapping from bits to voltage levels.

12. The method of claim 10, wherein a number of stages of the Trellis diagram is determined based on the decoding scheme and the type of the read page.

13. The method of claim 10, wherein the determining of the optimal path comprises calculating accumulated mutual information over the Trellis diagram.

14. The method of claim 10, further comprising:
updating the channel distribution of the read page based on results of a successful previous read of the read page.

15. A memory system, comprising:
a memory device comprising a plurality of memory cells; and
a memory controller configured to:
select a channel distribution among a plurality of channel distributions that corresponds to a read page of the memory device to be read in response to a read command;
generate a Trellis diagram based on a decoding scheme and a type of the read page;
determine an optimal path through the Trellis diagram using the selected channel distribution according to a dynamic programming algorithm; and
find read thresholds using the optimal path for performing a read of the read page.

16. The memory system of claim 15, wherein a total number of the read thresholds is determined based on the decoding scheme, the type of the read page, and a mapping from bits to voltage levels.

17. The memory system of claim 15, wherein the plurality of channel distributions are initially estimated for each page of the memory device from a page number of the corresponding page, a program/erase (P/E) count of the corresponding page, and a retention time of the corresponding page.

18. The memory system of claim 15, wherein the memory controller updates the channel distribution of the read page based on results of a successful previous read of the read page.

19. A method of finding read thresholds for reading a memory device of a memory system, the method comprising:
selecting, by a memory controller, a channel distribution among a plurality of channel distributions that corresponds to a read page of the memory device to be read in response to a read command;
generating, by the memory controller, a Trellis diagram based on a decoding scheme and a type of the read page;
determining, by the memory controller, an optimal path through the Trellis diagram using the selected channel distribution according to a dynamic programming algorithm; and
finding, by the memory controller, the read thresholds from the optimal path.

20. The method of claim 19, wherein the plurality of channel distributions are initially estimated for each page of the memory device from a page number of the corresponding page, a program/erase (P/E) count of the corresponding page, and a retention time of the corresponding page.

* * * * *